United States Patent [19]

Meyrueix et al.

[11] Patent Number: 5,028,865
[45] Date of Patent: Jul. 2, 1991

[54] DEVICE HAVING MAIN AND SECONDARY OPTICAL SENSORS

[75] Inventors: Paul Meyrueix, Paris; Denis Chatrefou, Epinay Sur Senart; Jean Simon, Paris, all of France

[73] Assignee: PSC Protections et Systemes de Controle, Montrouge, France

[21] Appl. No.: 381,428

[22] Filed: Jul. 18, 1989

[30] Foreign Application Priority Data

Jul. 21, 1988 [FR] France .............................. 88 09873

[51] Int. Cl.$^5$ .......................................... G01R 31/00
[52] U.S. Cl. ...................................... 324/96; 324/105; 350/355
[58] Field of Search ............... 350/355, 356, 400, 407; 324/96, 105

[56] References Cited

U.S. PATENT DOCUMENTS

| 3,936,742 | 2/1976 | Krause | 324/96 |
| 4,002,975 | 1/1977 | Erickson et al. | 324/501 |
| 4,227,082 | 10/1980 | Mayeux et al. | 250/336.1 |
| 4,269,483 | 5/1981 | Feldtkeller | 324/96 |
| 4,539,521 | 9/1985 | Matsumato | 324/96 |
| 4,612,500 | 9/1986 | Chen et al. | 324/105 |
| 4,631,402 | 12/1986 | Nagatsuma et al. | 324/96 |
| 4,752,141 | 6/1988 | Sun et al. | 324/96 |
| 4,812,767 | 3/1989 | Jaketoni | 324/96 |

FOREIGN PATENT DOCUMENTS 0083196 7/1983 European Pat. Off. .
57-184974 11/1982 Japan .
2164146 3/1986 United Kingdom .

Primary Examiner—Kenneth Wieder
Assistant Examiner—William J. Burns
Attorney, Agent, or Firm—Sughrue, Mion, Zinn, Macpeak & Seas

[57] ABSTRACT

The device of the invention comprises a main optical sensor (3) suitable for measuring a changing physical parameter, and a secondary optical sensor (6) suitable for measuring a disturbance which influences the measurement of said physical parameter, but for which the frequency spectrum is disjoint from that of the parameter. The sensors (3) and (6) are connected in series such that the main sensor serves to modulate the beam received by the secondary sensor.

8 Claims, 1 Drawing Sheet

DEVICE HAVING MAIN AND SECONDARY OPTICAL SENSORS

The invention relates to a device for measuring a changing physical parameter, the device comprising: light-emitting means suitable for producing at least one exciting light beam; a first optical sensor subjected to the influence of said physical parameter, receiving at least one exciting beam, and producing at least one corresponding modified beam whose polarization state depends on the value of said physical parameter; and detection means receiving at least one modified beam coming from said first sensor and producing at least one main electrical signal dependent on said parameter.

Devices of this type are well known in numerous applications, in particular for measuring alternating electrical voltages.

Regardless of the physical parameter being measured, it very often happens that disturbing effects, such as temperature, have an effect on the measurement, either because the disturbances act on the parameter in question to an extent which it is important to discover, or else because they degrade the measurement, which therefore needs to be corrected.

In all cases, one solution consists in placing a secondary sensor, e.g. a temperature sensor, suitable for providing additional information representative of the value of the temperature.

When the first sensor designed to measure the main physical parameter is of the optical type, it may, a priori, be appropriate to measure the disturbance by using a sensor which is also of the optical type.

However, this approach generally leads to an assembly which is too complex to be implemented, insofar as the changes in the disturbance (in particular when the disturbance is temperature) are at a frequency which is often very low, such that the secondary sensor (e.g. the optical thermometer) needs to be provided with a light source which is modulated in polarization or phase, whereas the first sensor used for measuring the main physical parameter can generally make do with a source of unmodulated light.

In this context, the object of the present invention is to provide a device which combines a main optical sensor for measuring a changing parameter and a secondary optical sensor for measuring the disturbance, and in which there is no need to provide a special light source for the secondary sensor.

To this end, the device of the invention which is intended to measure a changing physical parameter, and which comprises: light-emitting means suitable for producing at least one exciting light beam; a first optical sensor subjected to the influence of said physical parameter, receiving at least one exciting beam, and producing at least one corresponding modified beam whose polarization state depends on the value of said physical parameter; and detection means receiving at least one modified beam coming from said first sensor and producing at least one main electrical signal dependent on said parameter; is essentially being characterized in that it includes a beam separator making two modified beams available, in that it further includes a second optical sensor responsive to a disturbance and subjected to variations in said disturbance which, should they exist, are slower than the variations in said physical parameter, said second sensor receiving one of the two modified beams and producing a doubly-modified beam whose polarization state depends both on said parameter and on the disturbance, in that said detection means include additional means for detecting said doubly-modified beam and for producing an additional electrical signal dependent both on said parameter and on the disturbance, and in that said device also includes processing means for extracting a signal representative of the disturbance by virtue of the differences between said main signal and said additional signal.

This device is usable in particular when the first sensor has undesirable sensitivity to the disturbance, e.g. temperature; in this case, the first and second sensors are placed in a common environment with respect to the disturbance, e.g. in the same thermal environment, and the processing means include means for combining the signal representative of the disturbance (e.g. temperature) at least with the main signal or with a signal derived therefrom in order to deliver a corrected signal representative of said physical parameter.

In a simple embodiment, the second sensor may comprise a birefringent plate whose birefringence depends on the disturbance.

One possible application of a device of the invention is where the physical parameter is an oscillating voltage.

In this case, the first sensor advantageously comprises a crystal of bismuth $Bi_4Ge_3O_{12}$ which is elongate in shape and which is terminated by two faces covered by respective electrodes, with at least one of the electrodes being transparent to pass light, and with the alternating voltage to be measured being applied directly across the electrodes.

In addition, it may be desirable, in particular in order to obtain greater immunity to disturbances, for the crystal to be oriented in such a manner that its crystal axis (0, 0, 1) lies parallel to the direction of at least one of the exciting beams.

Other characteristics and advantages of the invention appear clearly from the following description thereof given by way of non-limiting example and with reference to the accompanying drawing, in which.

Figure 1:
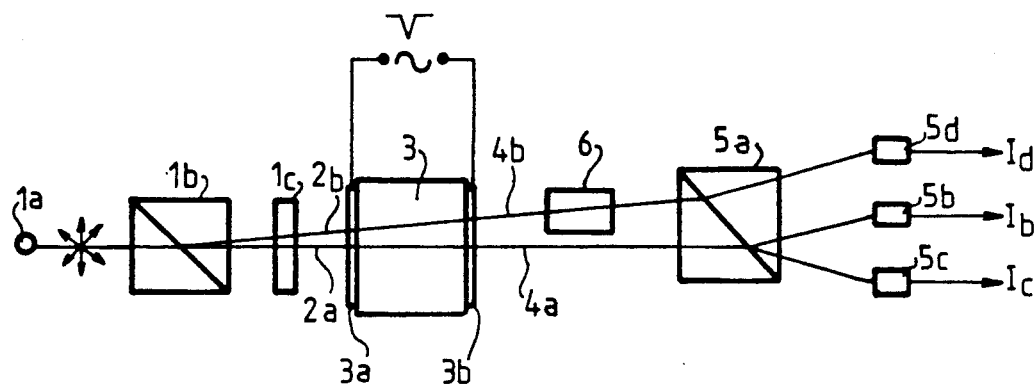
FIG. 1 is a diagram shown the optical portion of a device of the invention.

The device shown in FIG. 1 is intended to measure a changing physical parameter such as an alternating voltage V.

This device firstly comprises light-emitting means constituted by a light source 1a, a Rochon polarizer 1b, and a quarterwave plate 1c. The source is designed to produce depolarized light which the Rochon polarizer splits into two linearly polarized beams. The quarterwave plate has its axes at 45° to the axes of the polarizer 1b and serves merely to transform the linear polarization state of the beams delivered by the polarizer 1b into a circular polarization state, such that the need to provide such a plate depends on the particular type of optical sensor used in the device. In the present case, the set of components 1a to 1c produces two circularly polarized exciting light beams 2a and 2b.

The device then includes an optical sensor 3 which is subjected to the influence of the alternating electrical voltage V that constitutes a changing physical parameter, i.e. a variable physical magnitude whose frequency spectrum includes non-zero frequencies, e.g. a single spectrum line at 50 Hz.

The optical sensor 3 is constituted, for example, by a Pockels effect electro-optical crystal, such as a crystal of bismuth germanate $Bi_4Ge_3O_{12}$. This crystal is isotropic when no field is applied thereto and it becomes anisotropic (linear birefringence) under the influence of an applied field. In the configuration described, its optical axes lie in the same directions as the axes of the quarterwave plate 1c.

This crystal is elongate in shape and is terminated by two plane faces covered by respective transparent electrodes 3a and 3b, with the alternating voltage V to be measured being applied directly across these electrodes.

The face of the optical sensor 3 which is covered by the electrode 3a receives the exciting beams 2a and 2b which pass through the sensor, and leave it via its face covered by the electrode 3b in the form of corresponding modified beams 4a and 4b whose polarization states at any instant depend on the instantaneous value of the voltage V.

The device also includes main detection means preferably constituted by a Wollaston analyzer 5a and two photoreceivers e.g. two photodiodes 5b and 5c.

The analyser 5a is oriented so that its optical axes lie in the same directions as the natural axes of the crystal being subjected to the voltage. This analyzer separates the orthogonal components of modified beam 4a (referred to by convention herein as the "main beam"), with the respective intensities thereof being detected by the diodes 5b and 5c which provide images thereof in the form of corresponding electrical signals 1b and 1c. By convention, these signals taken together are referred to as constituting the "main signal", with each of these signals constituting one of the components of the main signal.

Except insofar as the polarizer 1b acts as a beam splitter and provides two exciting beams 2a and 2b, and the sensor 3 is a crystal of bismuth germanate directly subjected to the influence of a parameter to be measured, the assembly described above is a conventional polarimetric assembly of a type already known for measuring voltage, e.g. an alternating voltage V.

However, the use of such a device, e.g. in an environment liable to be subjected to large changes of temperature, runs up against the problem of the sensitivity of the sensor, i.e. the crystal of bismuth germanate in this case, depending on temperature such that the polarization state of the main modified beam 4a which, ideally, should be representative of the voltage V, also varies with temperature.

In order to take account of this phenomenon and correct the effects thereof, the present invention provides a second optical sensor 6 which is sensitive to temperature and which is placed on the path of the other modified beam 4b, referred to as the "secondary beam". This produces a doubly-modified beam 4c whose polarization state depends both on the voltage V and on the temperature of the second optical sensor.

Insofar as the second optical sensor, e.g. constituted by a birefringent plate such as a quartz plate, modifies the polarization state of the beam 4b in a manner which depends on temperature, the polarization states of the beams 4a and 4c necessarily depend differently on temperature. Even if there is a temperature or a given range of temperatures for which the second sensor remains inactive, the beams 4a and 4c will have the same polarization station only for said temperature or said range.

Because of its double dependence, the beam 4c is modulated as a function of the value of the parameter to be measured, i.e. the voltage V in this case. The invention thus uses the sensor 3 subjected to the influence of the physical parameters to be measured as a light modulator, thereby firstly making it possible to use only one light source 1a, and secondly making it pointless to provide an additional modulator. A potential drawback lies in the effectiveness of the device being limited to cases where the second optical sensor 6 is subjected to variations which are slower than the variations in the physical parameter to be measured. However, this condition is easily satisfied when the parameter to be measured is a 50 Hz alternating voltage.

As will readily be understood by the person skilled in the art, instead of being a Rochon polarizer, the beam separator could be constituted by a semi-transparent plate disposed on the path of the modified beam 4a and suitable for giving rise to the secondary beam 4b.

In addition to the analyzer 5a and the diodes 5b and 5c, the detection means include an additional diode 5d for detecting the double-modified beam 4c after it has passed through the analyzer 5a and serving to produce an additional electrical signal $I_d$ which depends both on the measured physical parameter and on temperature.

The device also includes processing means, and one possible embodiment thereof is described in detail with reference to FIG. 2. These means respond to the differences between the additional signal $I_d$ and the main signal $I_b$ and/or $I_c$ to extract a signal representative of the temperature of the second optical sensor.

This technique has a considerable advantage when the first sensor 3 suffers from undesirable sensitivity to temperature, as is indeed the case of Pockels effect sensors.

So long as the first and second sensors are placed in a common thermal environment, it then becomes possible to combine the signal representative of temperature at least with the main signal or with a signal derived therefrom so as to obtain a signal of the parameter being measured, including corrections for the interferring effects of temperature.

The invention thus makes it possible to provide a high accuracy Pockels effect voltage sensor.

In such a device, the sensor 3, which is advantageously constituted by a crystal of bismuth germanate in spite of this crystal's temperature dependence, is preferably oriented in such a manner that its crystal axis (0, 0, 1) lies parallel to the direction of at least one of the exciting beams, e.g. the beam 4a, with this disposition serving, in particular, to obtain a sensor which is sensitive solely to the voltage V regardless of external electrical disturbances, and whose sensitivity is independent of the geometry of the crystal used.

Figure 2:
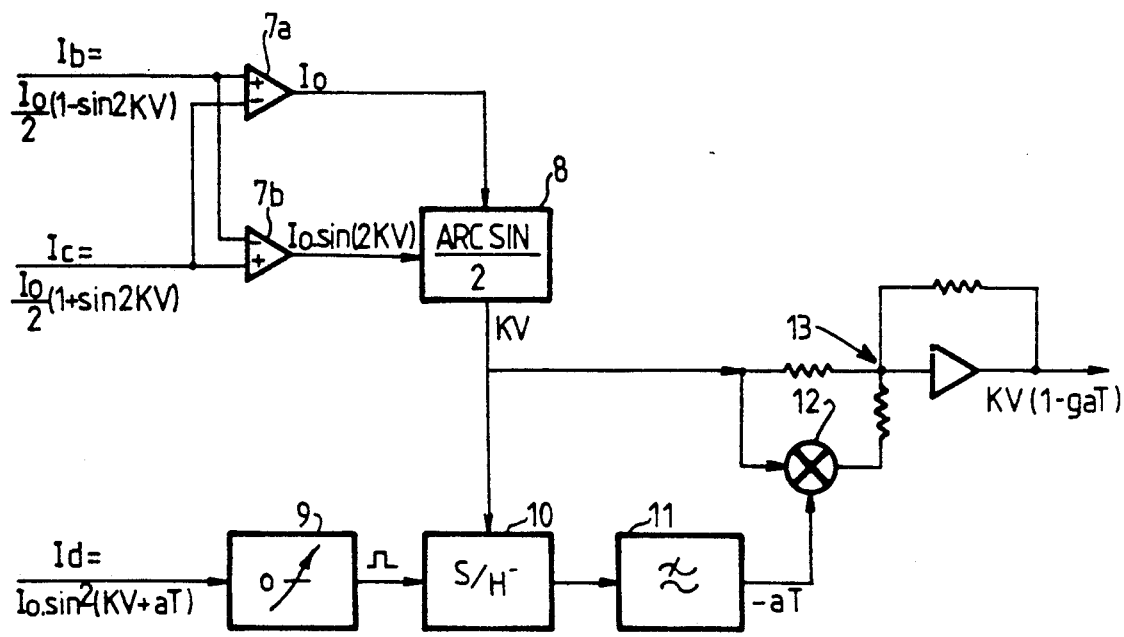
FIG. 2 is a diagram of a processing circuit for a device of the invention.

FIG. 2 is a diagram of a processing circuit for a Pockels effect alternating voltage sensor that uses a bismuth germanate crystal which is temperature compensated in accordance with the teaching of the present invention.

This processing circuit receives the first and second components $I_b$ and $I_c$ of the main signal together with the additional signal $I_d$ as respectively produced by photodetectors 5b, 5c, and 5d.

The values of these signals are given by the following expressions:

$$I_b = (I_o/2) \cdot (1 - \sin 2K \cdot V);$$

$$I_c = (I_o/2) \cdot (1 - \sin 2K \cdot V);$$

and $$I_d = I_o \cdot \sin^2(K.V + a.T).$$

In these expressions: $I_o$ is a magnitude related to the intensity of the source $1a$; K and a are two proportionality constants, with K depending on the first optical sensor 3 and a depending on the second sensor 6; V is the instantaneous value of the alternating voltage to be measured; and T is the temperature difference between the sensors 3 and 6 and the temperature which the phase shift generated by the sensor 6 is equal to 45°.

It is preferable for the average temperature representative of normal operating conditions of the device to be selected as the temperature at which T is zero.

The signals $I_b$ and $I_c$ are applied to two amplifiers connected so that the first amplifier 7a produces a signal representative of their sum $I_o$, and so that the second amplifier 7b produces a signal representative of their difference $I_o \cdot \sin(2.K.V)$.

These sum and difference signals are delivered to a function generator 8 which produces an output signal representative of half the arc-sine of the ratio of the difference signal divided by the sum signal, i.e. K.V.

The additional signal $I_d$ is applied to a zero crossing detector 9 which, on each zero crossing in the additional signal $I_d$, operates a sample-and-hold circuit 10 which receives the signal representative of K.V.

Since the sum K.V+a.T is zero at the zero crossings in $I_d$, the signal stored in the sample-and-hold circuit 10 is representative of −a.T.

The signal −a.T output by the sample-and-hold circuit 10 and filtered by a lowpass filter 11 is applied to one of the inputs of a four-quadrant analog multiplier 12 having another input connected to receive the signal K.V from the function generator 8.

The output signal −a.T.K.V from the multiplier 12 is amplified by the gain g of an amplifier 13 and is simultaneously added in said amplifier to the output signal from the function generator 8, such that the output signal from the amplifier 13 is representative of the magnitude K.V−g.a.T.K.V.

As a result, this output signal constitutes a temperature corrected version of the signal K.V, with the correction resulting from the following effects.

The temperature variation of the sensitivity of the sensor 3 can be represented overall as variation in the parameter K, which instead of conserving a constant value $K_o$ takes on a value $K = K_o \cdot (1 + b.T)$ where b is a constant which is known or easily measurable and which depends on the material from which the sensor 3 is made.

The gain g is selected so that g=b/a, and as a result the output signal from the amplifier 13 representative of K.V−g.a.T.K.V is also representative of $K_o.V.(1−b^2.T^2)$. Insofar as the magnitude $b^2.T^2$ is very small, the output signal from the amplifier 13 can therefore be considered as being representative of $K_o.V$, regardless of the temperature corresponding to T.

We claim:

1. A device for measuring a changing physical parameter, the device comprising: light-emitting means suitable for producing at least one exciting light beam; a first optical sensor subjected to the influence of said physical parameter, receiving at least one exciting beam, and producing at least one corresponding modified beam whose polarization state depends on the value of said physical parameter; and detection means receiving at least one modified beam coming from said first sensor and producing at least one main electrical signal dependent on said parameter, the device being characterized in that it includes a beam separator making two modified beams available, in that it further includes a second optical sensor responsive to a disturbance and subjected to variations in said disturbance which, should they exist, are slower than the variations in said physical parameter, said second sensor receiving one of the two modified beams and producing a doubly-modified beam whose polarization state depends both on said parameter and on the disturbance, in that said detection means include additional means for detecting said doubly-modified beam and for producing an additional electrical signal dependent both on said parameter and on the disturbance, and in that said device also includes processing means for extracting a signal representative of the disturbance by virtue of the differences between said main signal and said additional signal.

2. A device according to claim 1, characterized in that said first sensor presents undesirable sensitivity to said disturbance, in that said first and second sensors are placed in an environment which is the same with respect to said disturbance, and in which said processing means include means for combining said signal representative of the disturbance at least with the main signal or with a signal derived therefrom in order to provide a corrected signal representative of said parameter.

3. A device according to claim 1 or 2, characterized in that said disturbance is temperature.

4. A device according to claim 1, characterized in that said second sensor comprises a birefringent plate whose birefringence depends on the disturbance.

5. A device according to claim 1 characterized in that said physical parameter is an alternating voltage.

6. A device according to claim 1, characterized in that said first sensor comprises a crystal of bismuth germanate $Bi_4Ge_3O_{12}$.

7. A device according to either one of claims 5 and 6, characterized in that said first sensor is elongate in shape and is terminated by two plane faces each covered by a respective electrode with at least one of the electrodes being transparent to pass light, and in that said alternating voltage to be measured is applied directly across said electrodes.

8. A device according to claim 7, characterized in that said crystal is oriented in such a manner that its crystal axis (0, 0, 1) lies parallel to the direction of at least one of the exciting beams.

* * * * *